(12) United States Patent
Chen

(10) Patent No.: US 11,271,192 B2
(45) Date of Patent: Mar. 8, 2022

(54) OLED ARRAY SUBSTRATE AND METHOD FOR MANUFACTURING SAME

(71) Applicant: WUHAN CHINA STAR OPTOELECTRONICS SEMICONDUCTOR DISPLAY TECHNOLOGY CO., LTD., Wuhan (CN)

(72) Inventor: Liang Chen, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 605 days.

(21) Appl. No.: 16/316,830

(22) PCT Filed: Dec. 20, 2018

(86) PCT No.: PCT/CN2018/122390
§ 371 (c)(1),
(2) Date: Jan. 10, 2019

(87) PCT Pub. No.: WO2020/077804
PCT Pub. Date: Apr. 23, 2020

(65) Prior Publication Data
US 2021/0343991 A1 Nov. 4, 2021

(30) Foreign Application Priority Data

Oct. 19, 2018 (CN) .......................... 201811222680.6

(51) Int. Cl.
*H01L 51/56* (2006.01)
*H01L 51/52* (2006.01)
*H01L 27/15* (2006.01)

(52) U.S. Cl.
CPC .............. *H01L 51/56* (2013.01); *H01L 27/15* (2013.01); *H01L 51/5256* (2013.01); *H01L 51/5259* (2013.01)

(58) Field of Classification Search
CPC ..................... H01L 51/5256; H01L 51/5259
See application file for complete search history.

(56) References Cited

U.S. PATENT DOCUMENTS 6,624,568 B2 * 9/2003 Silvernail ........... H01L 51/5237
313/504
8,053,984 B2 * 11/2011 Lee .................. H01L 51/5256
313/512
(Continued)

FOREIGN PATENT DOCUMENTS

CN 104505468 A * 4/2015 ......... H01L 51/5256
CN 106784381 A 5/2017
(Continued)

OTHER PUBLICATIONS

Machine translation, Habemann, WIPO Pat. Pub. No. WO 2006/082111, translation date: Sep. 4, 2021, Espacenet, all pages. (Year: 2021).*
(Continued)

*Primary Examiner* — Victoria K. Hall
(74) *Attorney, Agent, or Firm* — Osha Bergman Watanabe & Burton LLP

(57) ABSTRACT

The present disclosure provides an organic light-emitting diode (OLED) array substrate. The OLED array substrate includes a baseplate, wherein an OLED unit is disposed on the baseplate; a first inorganic layer disposed on the OLED unit; an organic layer disposed on the first inorganic layer; an inorganic absorption layer disposed on the organic layer,
(Continued)

wherein the inorganic absorption layer absorbs water and oxygen; and a second inorganic layer disposed on the inorganic absorption layer.

12 Claims, 1 Drawing Sheet

(56) References Cited

U.S. PATENT DOCUMENTS

| | | | | |
|---|---|---|---|---|
| 8,450,926 | B2* | 5/2013 | Roberts | H01L 51/5203 |
| | | | | 313/512 |
| 9,142,798 | B2* | 9/2015 | Chen | H01L 51/5256 |
| 9,263,700 | B2* | 2/2016 | van Mol | G02B 1/14 |
| 10,084,155 | B2* | 9/2018 | Cui | H01L 51/5256 |
| 10,745,795 | B2* | 8/2020 | Ramadas | C23C 14/08 |
| 2003/0117066 | A1* | 6/2003 | Silvernail | H01L 51/5237 |
| | | | | 313/504 |
| 2003/0184221 | A1* | 10/2003 | Mishima | H01L 51/5231 |
| | | | | 313/512 |
| 2005/0255285 | A1* | 11/2005 | Uchibori | H01L 23/26 |
| | | | | 428/76 |
| 2007/0184300 | A1* | 8/2007 | Yokose | B01J 20/28057 |
| | | | | 428/690 |
| 2008/0085652 | A1* | 4/2008 | Winters | H01L 27/322 |
| | | | | 445/4 |
| 2008/0265764 | A1* | 10/2008 | Kim | H01L 51/5259 |
| | | | | 313/504 |
| 2010/0157585 | A1* | 6/2010 | Diekmann | F21V 23/003 |
| | | | | 362/228 |
| 2010/0215929 | A1* | 8/2010 | Seo | H01L 51/5253 |
| | | | | 428/213 |
| 2011/0132449 | A1* | 6/2011 | Ramadas | H01L 51/56 |
| | | | | 136/256 |
| 2011/0140119 | A1* | 6/2011 | Oh | H01L 51/5259 |
| | | | | 257/72 |
| 2011/0147789 | A1* | 6/2011 | Lee | H01L 51/5253 |
| | | | | 257/100 |
| 2012/0125431 | A1* | 5/2012 | Oizumi | H01L 51/5259 |
| | | | | 136/256 |
| 2012/0181914 | A1* | 7/2012 | Fukuda | B32B 15/08 |
| | | | | 313/46 |
| 2012/0216864 | A1* | 8/2012 | Gauthier | H01L 51/448 |
| | | | | 136/263 |
| 2013/0059155 | A1* | 3/2013 | Choi | C23C 16/26 |
| | | | | 428/408 |
| 2013/0126837 | A1* | 5/2013 | Kim | H01L 51/5256 |
| | | | | 257/40 |
| 2014/0027739 | A1* | 1/2014 | van de Weijer | H01L 51/5259 |
| | | | | 257/40 |
| 2014/0049825 | A1* | 2/2014 | van Mol | H01L 51/5253 |
| | | | | 359/513 |
| 2014/0217382 | A1* | 8/2014 | Kwon | H01L 51/5246 |
| | | | | 257/40 |
| 2015/0249120 | A1* | 9/2015 | Cheng | H01L 27/3272 |
| | | | | 257/40 |
| 2015/0318516 | A1* | 11/2015 | Ito | H01L 51/5256 |
| | | | | 257/40 |
| 2015/0357600 | A1* | 12/2015 | Sonoda | H01L 51/5259 |
| | | | | 257/98 |
| 2016/0043347 | A1* | 2/2016 | Sun | H01L 51/5256 |
| | | | | 257/40 |
| 2016/0072099 | A1* | 3/2016 | Okamoto | C23C 16/50 |
| | | | | 257/40 |
| 2016/0093830 | A1* | 3/2016 | Yoo | H01L 33/56 |
| | | | | 428/413 |
| 2016/0218320 | A1* | 7/2016 | Chen | H01L 51/5246 |
| 2016/0258060 | A1* | 9/2016 | Huh | C23C 16/455 |
| 2016/0329524 | A1* | 11/2016 | Cha | H01L 51/5256 |
| 2017/0040570 | A1* | 2/2017 | Kim | H01L 51/56 |
| 2017/0084864 | A1* | 3/2017 | Popp | C08K 5/101 |
| 2017/0104168 | A1* | 4/2017 | Shi | H01L 51/56 |
| 2017/0133630 | A1* | 5/2017 | Kim | H01L 51/5246 |
| 2017/0197840 | A1* | 7/2017 | Showalter | B01J 8/0278 |
| 2017/0287990 | A1* | 10/2017 | Choi | H01L 51/5246 |
| 2017/0331064 | A1* | 11/2017 | Trummer-Sailer | H01L 51/107 |
| 2017/0373275 | A1* | 12/2017 | Frantz | C09D 1/00 |
| 2018/0040851 | A1* | 2/2018 | Sasaki | H01L 27/3276 |
| 2018/0102500 | A1* | 4/2018 | Harai | C08L 53/025 |
| 2018/0183006 | A1* | 6/2018 | Ishida | H01L 51/5246 |
| 2018/0248153 | A1* | 8/2018 | Cui | H01L 27/3244 |
| 2018/0331320 | A1* | 11/2018 | Su | H01L 27/3246 |
| 2019/0067641 | A1* | 2/2019 | Shin | H01L 51/5012 |
| 2019/0103579 | A1* | 4/2019 | Kim | H01L 51/529 |
| 2019/0115562 | A1* | 4/2019 | Moon | B32B 27/36 |
| 2019/0127609 | A1* | 5/2019 | Johnson | B32B 7/12 |
| 2019/0157618 | A1* | 5/2019 | Park | H01L 51/5253 |
| 2019/0198814 | A1* | 6/2019 | Ge | B01D 53/28 |
| 2019/0312231 | A1* | 10/2019 | Huang | H01L 51/56 |
| 2020/0028114 | A1* | 1/2020 | Zhai | H01L 27/323 |
| 2020/0058894 | A1* | 2/2020 | Kim | H01L 51/5253 |
| 2020/0091460 | A1* | 3/2020 | Yoo | H01L 51/5253 |
| 2021/0036260 | A1* | 2/2021 | Zhao | H01L 51/5253 |
| 2021/0091337 | A1* | 3/2021 | Zhao | H01L 51/003 |
| 2021/0328176 | A1* | 10/2021 | Li | H01L 51/5243 |
| 2021/0343987 | A1* | 11/2021 | Chen | B01J 23/06 |
| 2021/0367210 | A1* | 11/2021 | Cheng | H01L 51/52 |

FOREIGN PATENT DOCUMENTS

| | | | | |
|---|---|---|---|---|
| CN | 106848092 A | * | 6/2017 | H01L 51/52 |
| CN | 106848092 A | | 6/2017 | |
| WO | WO-2006082111 A1 | * | 8/2006 | H01L 51/5246 |

OTHER PUBLICATIONS

Machine translation, Xie, Chinese Pat. Pub. No. CN 106848092, translation date: Sep. 4, 2021, Espacenet, all pages. (Year: 2021).*
Machine translation, Zhu, Chinese Pat. Pub. No. CN 104505468, translation date: Sep. 4, 2021, Espacenet, all pages. (Year: 2021).*

* cited by examiner

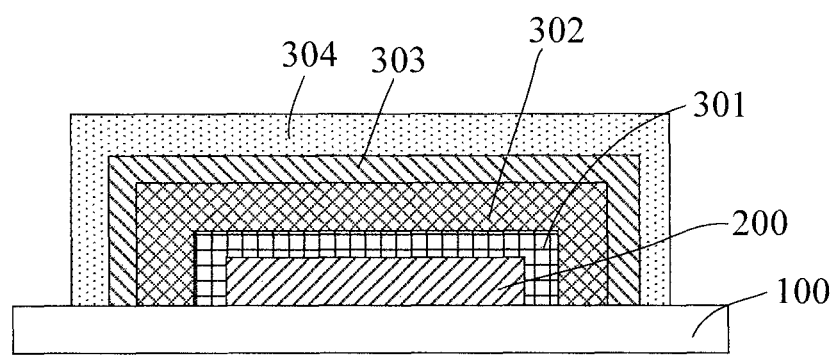

OLED ARRAY SUBSTRATE AND METHOD FOR MANUFACTURING SAME

FIELD OF INVENTION

The present disclosure relates to a field in display technology, and more particularly to an organic light-emitting diode (OLED) array substrate and a method for manufacturing same.

BACKGROUND

Among different types of flat panel displays, organic light-emitting diode (OLED) displays have outstanding properties, including being light in weight, thin, self-illuminating, short response times, wide viewing angles, a wide color gamut, high brightness, and low power consumption. Thus, succeeding liquid crystal displays (LCDs), OLED displays have gradually become a new display technology. Compared with LCDs, OLED displays save more energy, are thinner, and have wider viewing angles, with which the LCDs cannot compete.

The most essential component in an OLED display is an OLED device. An OLED device is extremely sensitive to water and oxygen. In case that water or oxygen contacts and enters the OLED device, light-emitting efficiency and lifespan of the OLED device are affected. This not only lowers light-emitting efficiency of the OLED device, but results in occurrence of dark spots in displayed images. Currently, one of the encapsulation techniques used for OLED devices is thin film encapsulation. Thin film encapsulation involves formation of a three-layered encapsulation structure. The thin film encapsulation structure is consisted of three layers, including an inorganic layer made of SiNx, an organic layer, and an inorganic layer made of SiNx. The thin film encapsulation structure is configured to prevent water and oxygen from entering OLED device.

However, according to prior art, the thin film encapsulation structure functions to block water and oxygen from entering OLED device only. Once water and oxygen permeate through the thin film encapsulation structure to contact and enter the OLED device, water and oxygen cannot be removed anyway. In addition, the organic layer reacts with water and oxygen coming from outside. Thus, there is no doubt that performance of the OLED device would be deteriorated dramatically, and lifespan thereof would be shortened.

Therefore, there is a need to provide a thin film encapsulation structure and a method for manufacturing same, in order to solve above-said problems existing in prior art.

SUMMARY OF DISCLOSURE

The present disclosure provides an organic light-emitting diode (OLED) array substrate and a method for manufacturing same in order to solve the problems existing in the prior art, where performance of OLED devices is not excellent and lifespan of OLED devices is short.

To solve the aforementioned problems, the present disclosure provides an organic light-emitting diode (OLED) array substrate, comprising:

a baseplate, wherein an OLED unit is disposed on the baseplate;

a first inorganic layer disposed on the OLED unit;

an organic layer disposed on the first inorganic layer;

an inorganic absorption layer disposed on the organic layer, wherein the inorganic absorption layer absorbs water and oxygen; and a second inorganic layer disposed on the inorganic absorption layer;

wherein the first inorganic layer and the second inorganic layer are made of silicon nitride, the organic layer is made of resin, and the inorganic absorption layer is made of iron.

In accordance with one preferred embodiment of the present disclosure, the first inorganic layer, the organic layer, the inorganic absorption layer, and the second inorganic layer constitute a thin film encapsulation structure that covers the OLED unit disposed on the baseplate without having the OLED unit exposed.

In accordance with one preferred embodiment of the present disclosure, the baseplate is a flexible baseplate made of polyimide.

In accordance with one preferred embodiment of the present disclosure, the first inorganic layer and the second inorganic layer each has a thickness less than or equal to 1 µm, the organic layer has a thickness ranging from 3 µm to 8 µm, and the inorganic absorption layer has a thickness ranging from 50 Å to 500 Å.

In addition, the present disclosure provides an organic light-emitting diode (OLED) array substrate, comprising:

a baseplate, wherein an OLED unit is disposed on the baseplate;

a first inorganic layer disposed on the OLED unit;

an organic layer disposed on the first inorganic layer;

an inorganic absorption layer disposed on the organic layer, wherein the inorganic absorption layer absorbs water and oxygen; and a second inorganic layer disposed on the inorganic absorption layer.

In accordance with one preferred embodiment of the present disclosure, the first inorganic layer, the organic layer, the inorganic absorption layer, and the second inorganic layer constitute a thin film encapsulation structure that covers the OLED unit disposed on the baseplate without having the OLED unit exposed.

In accordance with one preferred embodiment of the present disclosure, the baseplate is a flexible baseplate made of polyimide.

In accordance with one preferred embodiment of the present disclosure, the first inorganic layer and the second inorganic layer are made of silicon nitride, the organic layer is made of resin, and the inorganic absorption layer is made of iron.

In accordance with one preferred embodiment of the present disclosure, the first inorganic layer and the second inorganic layer each has a thickness less than or equal to 1 µm, the organic layer has a thickness ranging from 3 µm to 8 µm, and the inorganic absorption layer has a thickness ranging from 50 Å to 500 Å.

Furthermore, the present disclosure provides a method for manufacturing an organic light-emitting diode (OLED) array substrate, comprising steps of:

providing a baseplate, wherein an OLED unit is disposed on the baseplate;

forming a first inorganic layer on the OLED unit;

forming an organic layer on the first inorganic layer;

forming an inorganic absorption layer on the organic layer, wherein the inorganic absorption layer absorbs water and oxygen; and forming a second inorganic layer on the inorganic absorption layer.

In accordance with one preferred embodiment of the present disclosure, the first inorganic layer, the organic layer, the inorganic absorption layer, and the second inorganic layer constitute a thin film encapsulation structure that covers the OLED unit disposed on the baseplate without having the OLED unit exposed.

In accordance with one preferred embodiment of the present disclosure, the baseplate is a flexible baseplate made of polyimide.

In accordance with one preferred embodiment of the present disclosure, the first inorganic layer and the second inorganic layer are made of silicon nitride, the organic layer is made of resin, and the inorganic absorption layer is made of iron.

In accordance with one preferred embodiment of the present disclosure, the first inorganic layer and the second inorganic layer each has a thickness less than or equal to 1 µm, the organic layer has a thickness ranging from 3 µm to 8 µm, and the inorganic absorption layer has a thickness ranging from 50 Å to 500 Å.

Compared with prior art, the present disclosure provides an OLED array substrate and a method for manufacturing same. By disposing an inorganic absorption layer in the thin film encapsulation structure, where the inorganic absorption layer absorbs water and oxygen, water and oxygen are avoided from contacting and entering OLED unit, thus extending lifespan of OLED unit.

BRIEF DESCRIPTION OF DRAWINGS

FIG. 1 is a cross-sectional view of a structure of an organic light-emitting diode (OLED) array substrate according to the present disclosure.

DETAILED DESCRIPTION

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

As shown in FIG. 1, the present disclosure provides an organic light-emitting diode (OLED) array substrate. The OLED array substrate includes:

a baseplate 100, wherein an OLED unit 200 is disposed on the baseplate 100;

a first inorganic layer 301 disposed on the OLED unit 200;

an organic layer 302 disposed on the first inorganic layer 301;

an inorganic absorption layer 303 disposed on the organic layer 302, wherein the inorganic absorption layer absorbs water and oxygen; and a second inorganic layer 304 disposed on the inorganic absorption layer 303.

The first inorganic layer 301, the organic layer 302, the inorganic absorption layer 303, and the second inorganic layer 304 constitute a thin film encapsulation structure that covers the OLED unit 200 disposed on the baseplate 100 without having the OLED unit 200 exposed.

Preferably, the baseplate 100 is a flexible baseplate. For example, the flexible baseplate is made of polyimide. Moreover, the first inorganic layer 301 and the second inorganic layer 304 are made of silicon nitride (SiNx), and the organic layer 302 is made of resin. Preferably, the first inorganic layer 301 and the second inorganic layer 304 are formed by chemical vapor deposition (CVD), and the organic layer 302 is formed by inkjet printing.

According to the present disclosure, the inorganic absorption layer 303 is made of iron. In other words, the inorganic absorption layer 303 is an iron layer. Preferably, the inorganic absorption layer 303 is formed using physical vapor deposition (PVD) or sputtering.

To ensure excellent transparency of the encapsulation structure, the first inorganic layer 301 and the second inorganic layer 304 each has a thickness less than or equal to 1 µm, the organic layer 302 has a thickness ranging from 3 µm to 8 µm, and the inorganic absorption layer 303 has a thickness ranging from 50 Å to 500 Å.

According to the present disclosure, the inorganic absorption layer 303 is made of iron, therefore the inorganic absorption layer 303 absorbs water and oxygen. Even if water and oxygen permeate through or passes through the second inorganic layer 304, the inorganic absorption layer 303 absorbs water and oxygen coming from outside. Therefore, water and oxygen are prevented from further moving inwardly to contact the OLED unit 200, thus extending lifespan of the OLED unit 200.

In addition, the present disclosure provides a method for manufacturing an organic light-emitting diode (OLED) array substrate. The method includes steps of:

providing a baseplate 100, wherein an OLED unit 200 is disposed on the baseplate 100;

forming a first inorganic layer 301 on the OLED unit 200;

forming an organic layer 302 on the first inorganic layer 301;

forming an inorganic absorption layer 303 on the organic layer 302, wherein the inorganic absorption layer absorbs water and oxygen; and forming a second inorganic layer 304 on the inorganic absorption layer 303.

The first inorganic layer 301, the organic layer 302, the inorganic absorption layer 303, and the second inorganic layer 304 constitute a thin film encapsulation structure that covers the OLED unit 200 disposed on the baseplate 100 without having the OLED unit 200 exposed.

Preferably, the baseplate 100 is a flexible baseplate. For example, the flexible baseplate is made of polyimide. Moreover, the first inorganic layer 301 and the second inorganic layer 304 are made of silicon nitride (SiNx), and the organic layer 302 is made of resin. Preferably, the first inorganic layer 301 and the second inorganic layer 304 are formed by chemical vapor deposition (CVD), and the organic layer 302 is formed by inkjet printing.

According to the present disclosure, the inorganic absorption layer 303 is made of iron. In other words, the inorganic absorption layer 303 is an iron layer. Preferably, the inorganic absorption layer 303 is formed using physical vapor deposition (PVD) or sputtering.

To ensure excellent transparency of the encapsulation structure, the first inorganic layer 301 and the second inorganic layer 304 each has a thickness less than or equal to 1 µm, the organic layer 302 has a thickness ranging from 3 µm to 8 µm, and the inorganic absorption layer 303 has a thickness ranging from 50 Å to 500 Å.

According to the present disclosure, the inorganic absorption layer 303 is made of iron, therefore the inorganic absorption layer 303 absorbs water and oxygen. Even if water and oxygen permeate through or passes through the second inorganic layer 304, the inorganic absorption layer 303 absorbs water and oxygen coming from outside. Therefore, water and oxygen are prevented from further moving inwardly to contact the OLED unit 200, thus extending lifespan of OLED unit 200.

Compared with prior art, the present disclosure provides an OLED array substrate and a method for manufacturing same. By disposing an inorganic absorption layer in the thin film encapsulation structure, where the inorganic absorption layer absorbs water and oxygen, water and oxygen are prevented from contacting and entering OLED unit, thus extending lifespan of OLED unit.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. An organic light-emitting diode (OLED) array substrate, comprising:
   a baseplate;
   an OLED unit disposed on the baseplate;
   a first inorganic layer disposed on the OLED unit;
   an organic layer disposed on the first inorganic layer;
   an inorganic absorption layer made of iron and disposed on the organic layer to absorb water and oxygen; and
   a second inorganic layer disposed on the inorganic absorption layer.

2. The OLED array substrate according to claim 1, wherein the first inorganic layer, the organic layer, the inorganic absorption layer, and the second inorganic layer constitute a thin film encapsulation structure that covers the OLED unit disposed on the baseplate without having the OLED unit exposed.

3. The OLED array substrate according to claim 1, wherein the baseplate is a flexible baseplate made of polyimide.

4. The OLED array substrate according to claim 1, wherein the first inorganic layer and the second inorganic layer each has a thickness less than or equal to 1 μm, the organic layer has a thickness ranging from 3 μm to 8 μm, and the inorganic absorption layer has a thickness ranging from 50 Å to 500 Å.

5. The OLED array substrate according to claim 1, wherein the first inorganic layer and the second inorganic layer are made of silicon nitride.

6. The OLED array substrate according to claim 1, wherein the organic layer is made of resin.

7. A method for manufacturing an organic light-emitting diode (OLED) array substrate, comprising steps of:
   providing a baseplate;
   disposing an OLED unit on the baseplate;
   forming a first inorganic layer on the OLED unit;
   forming an organic layer on the first inorganic layer;
   forming an inorganic absorption layer on the organic layer, wherein the inorganic absorption layer is made of iron to absorb water and oxygen; and
   forming a second inorganic layer on the inorganic absorption layer.

8. The method for manufacturing the OLED array substrate according to claim 7, wherein the first inorganic layer, the organic layer, the inorganic absorption layer, and the second inorganic layer constitute a thin film encapsulation structure that covers the OLED unit disposed on the baseplate without having the OLED unit exposed.

9. The method for manufacturing the OLED array substrate according to claim 7, wherein the baseplate is a flexible baseplate made of polyimide.

10. The method for manufacturing the OLED array substrate according to claim 7, wherein the first inorganic layer and the second inorganic layer are made of silicon nitride.

11. The method for manufacturing the OLED array substrate according to claim 7, wherein the first inorganic layer and the second inorganic layer each has a thickness less than or equal to 1 μm, the organic layer has a thickness ranging from 3 μm to 8 μm, and the inorganic absorption layer has a thickness ranging from 50 Å to 500 Å.

12. The method for manufacturing the OLED array substrate according to claim 7, wherein the organic layer is made of resin.

* * * * *